(12) United States Patent
Wang et al.

(10) Patent No.: US 9,964,587 B2
(45) Date of Patent: May 8, 2018

(54) SEMICONDUCTOR STRUCTURE AND TESTING METHOD USING THE SAME

(71) Applicant: UNITED MICROELECTRONICS CORP., Hsinchu (TW)

(72) Inventors: Chien-Kuo Wang, Hsinchu (TW); Wen-Jung Liao, Hsinchu (TW); Chun-Liang Hou, Zhubei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 71 days.

(21) Appl. No.: 15/151,748

(22) Filed: May 11, 2016

(65) Prior Publication Data

US 2017/0328949 A1 Nov. 16, 2017

(51) Int. Cl.
*G01R 31/02* (2006.01)
*G01R 31/28* (2006.01)
*H01L 23/522* (2006.01)
*H01L 23/528* (2006.01)
*H01L 21/66* (2006.01)

(52) U.S. Cl.
CPC .......... *G01R 31/2884* (2013.01); *H01L 22/14* (2013.01); *H01L 22/30* (2013.01); *H01L 23/528* (2013.01); *H01L 23/5226* (2013.01)

(58) Field of Classification Search
CPC ..... H01L 22/34; H01L 23/525; H01L 23/528; G01R 31/2831; G01R 31/2853; G01R 31/2858
See application file for complete search history.

(56) References Cited

U.S. PATENT DOCUMENTS

| | | | | | |
|---|---|---|---|---|---|
| 5,712,510 | A | * | 1/1998 | Bui | H01L 23/5283 257/211 |
| 5,900,735 | A | * | 5/1999 | Yamamoto | G01R 31/2853 257/758 |
| 7,067,419 | B2 | | 6/2006 | Huang et al. | |
| 8,766,454 | B2 | | 7/2014 | Lim et al. | |
| 2003/0089987 | A1 | * | 5/2003 | Parikh | H01L 21/7681 257/758 |
| 2010/0181683 | A1 | * | 7/2010 | Jha | H01L 23/5226 257/774 |

* cited by examiner

*Primary Examiner* — Minh N Tang
(74) *Attorney, Agent, or Firm* — WPAT, PC

(57) ABSTRACT

A semiconductor structure includes at least two via chains. Each via chain includes at least one first conductive component, at least one second conductive component and at least one via. The first conductive component has an axis along an extending direction of the first conductive component. The via connects the first conductive component to the second conductive component. The via has a center defining a shift distance from the axis of the first conductive component. The shift distances of the via chains are different. A testing method using such a semiconductor structure includes drawing a resistance-shift distance diagram illustrating a relationship between the resistances of the via chains and the shift distances of the via chains. At least one dimensional feature is obtained from the resistance-shift distance diagram.

18 Claims, 7 Drawing Sheets

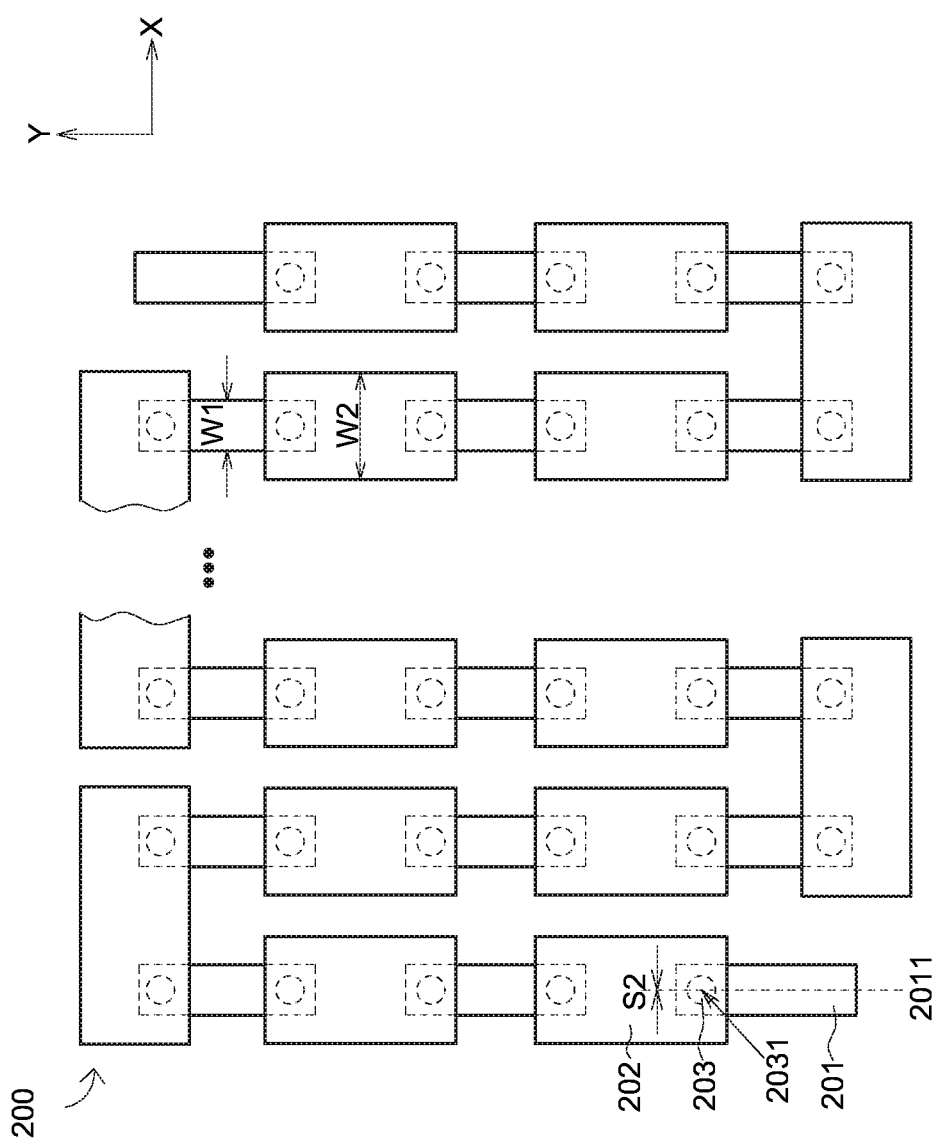
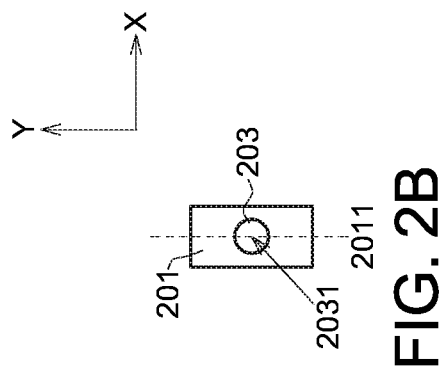
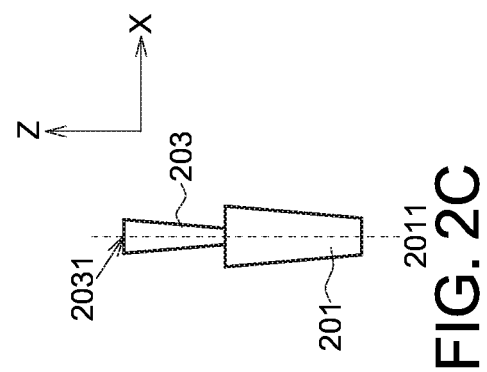
FIG. 2A
FIG. 2B
FIG. 2C

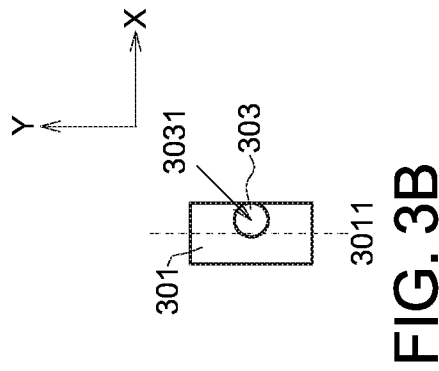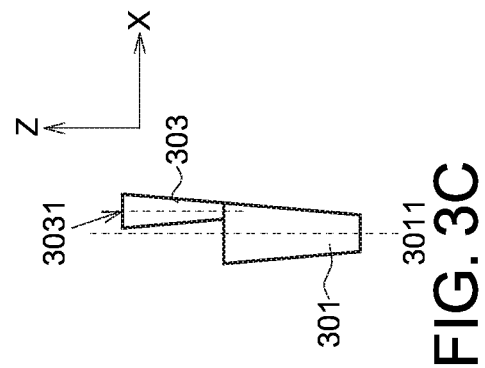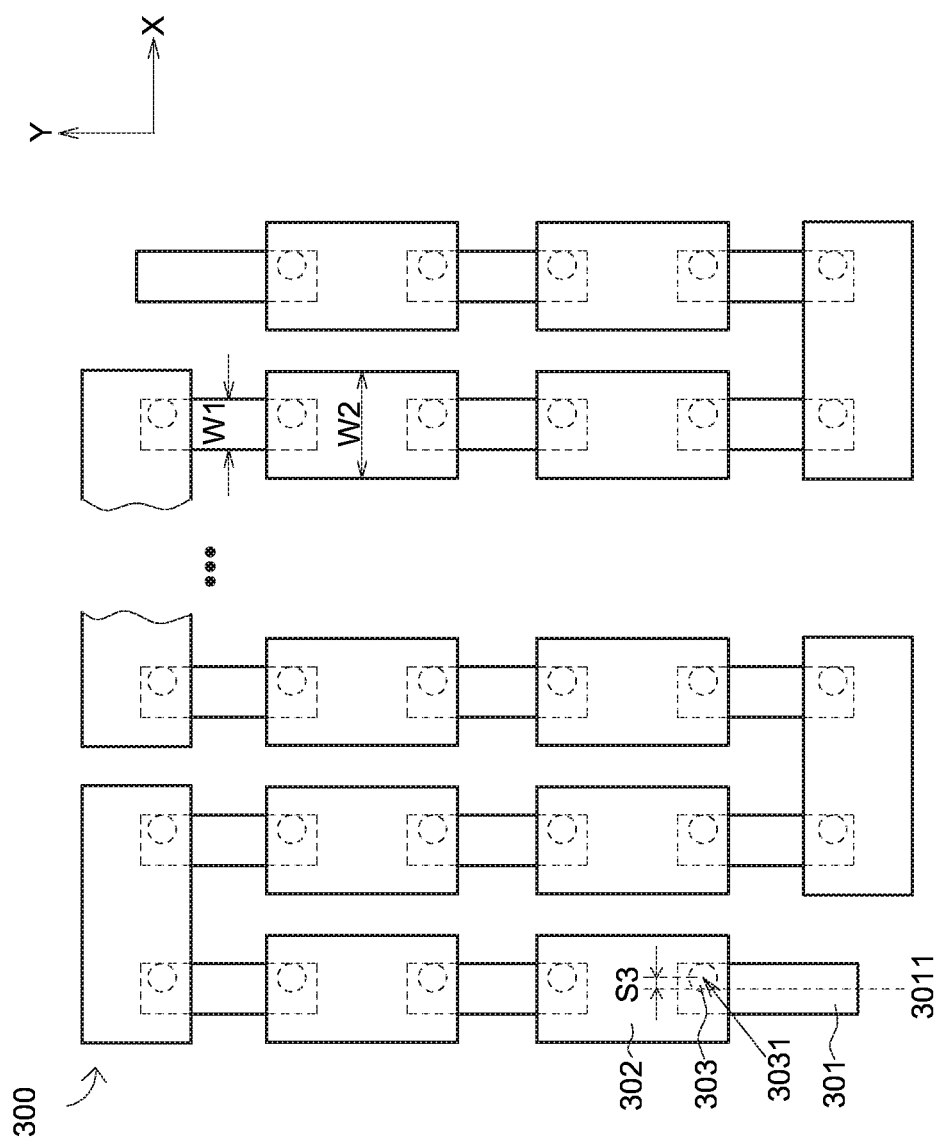

SEMICONDUCTOR STRUCTURE AND TESTING METHOD USING THE SAME

BACKGROUND

Technical Field

The disclosure relates to a semiconductor structure and a testing method using the same. More particularly, the disclosure relates to a semiconductor structure comprising via chains and a testing method using the same.

Description of the Related Art

Dimensional features, such as critical dimension (CD), alignment accuracy (AA), and the like, are important for a semiconductor structure. For example, the misalignment between a metal line in the uppermost metal layer and a via may significantly influence the yield loss. The dimensional features are typically designed and decided before the manufacturing of the semiconductor structure. Further, they may be measured after the related components have been formed. For example, an in-line CD measurement may be carried out for a single via or a single metal line.

SUMMARY

In this disclosure, a semiconductor structure and a testing method using such a semiconductor structure are provided. At least one dimensional feature can be obtained by the testing method, which is carried out during a wafer acceptance test, rather than an in-line measurement.

According to some embodiments, the semiconductor structure comprises at least two via chains. Each of the via chains comprises at least one first conductive component, at least one second conductive component and at least one via. The first conductive component has an axis along an extending direction of the first conductive component. The via connects the first conductive component to the second conductive component. The via has a center defining a shift distance from the axis of the first conductive component. The shift distances of the via chains are different.

According to some embodiments, the testing method comprises the following steps. First, a semiconductor structure is provided. The semiconductor structure comprises a plurality of via chains. Each of the via chains comprises at least one first conductive component, at least one second conductive component and at least one via. The first conductive component has an axis along an extending direction of the first conductive component. The via connects the first conductive component to the second conductive component. The via has a center defining a shift distance from the axis of the first conductive component. The shift distances of the via chains are gradually changed from a negative maximum shift distance value to a positive maximum shift distance value. Then, resistances of the via chains are measured, respectively. A resistance-shift distance diagram illustrating a relationship between the resistances and the shift distances is drawn. At least one dimensional feature is obtained from the resistance-shift distance diagram.

Figure 1B:
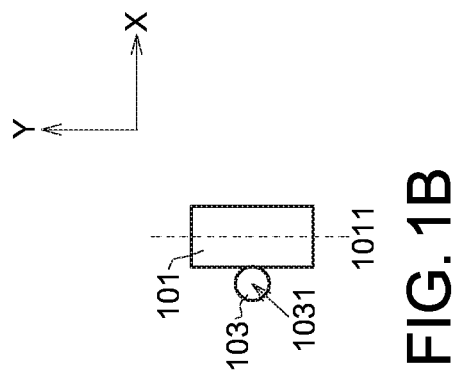
FIGS. 1A-1C to 4A-4C illustrate a semiconductor structure according to some embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. For clarity, the elements in the figures may not reflect their real sizes. Further, in some figures, undiscussed components may be omitted. It is contemplated that elements and features of one embodiment may be beneficially incorporated in another embodiment without further recitation.

Referring to FIGS. 1A-1C to 4A-4C, a semiconductor structure, which can be used in a testing method for at least one dimensional feature, is illustrated according to some embodiments. The semiconductor structure comprises at least two via chains. More typically, the semiconductor structure comprises a plurality of via chains. The drawings indicated by "A" shows exemplary top views of some via chains of the semiconductor structure, the drawings indicated by "B" shows enlarged top views of some components of the corresponding top views, and the drawings indicated by "C" shows corresponding cross-sectional views of the drawings indicated by "B".

Figure 1C:
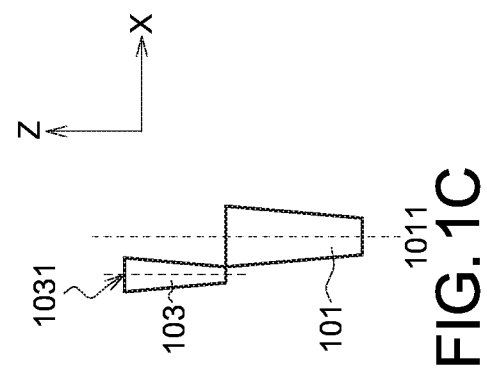
Figure 1A:
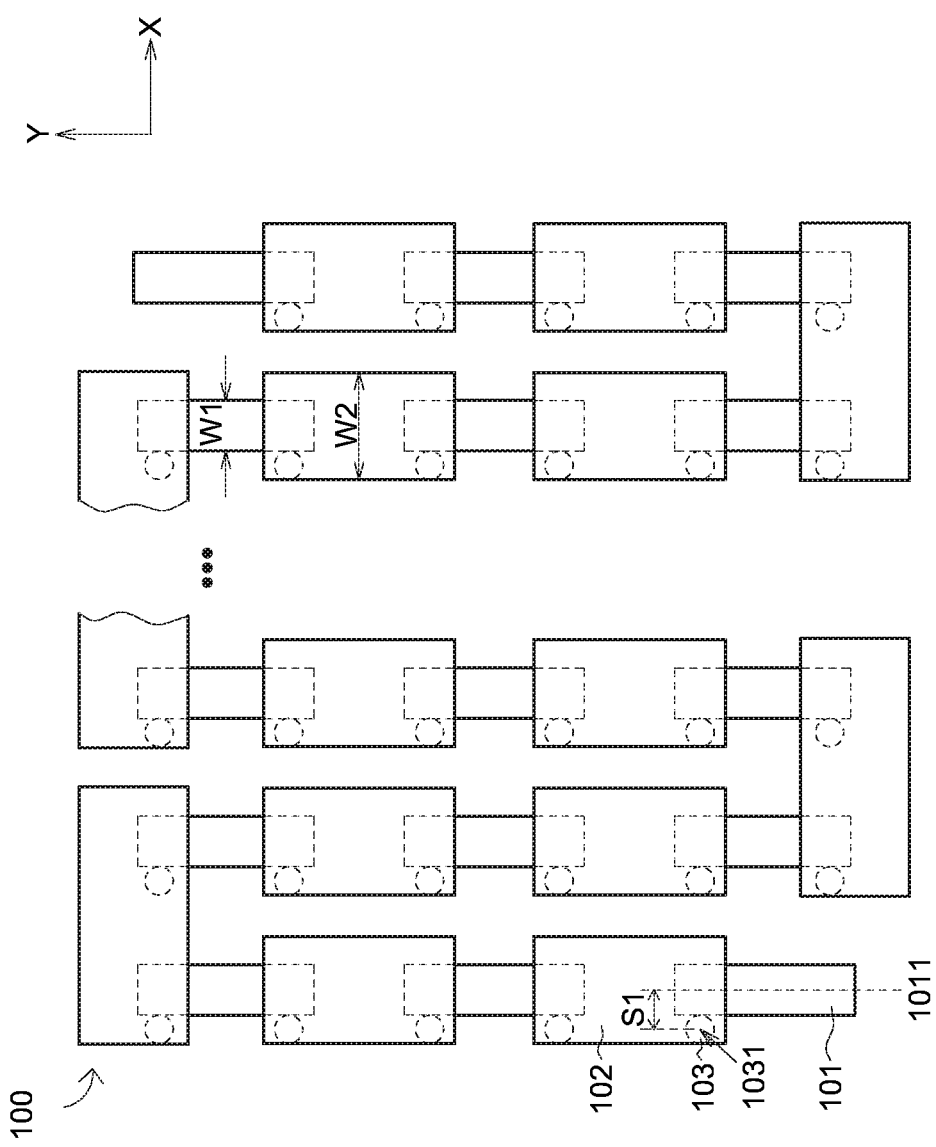

FIGS. 1A-1C illustrate a via chain 100. The via chain 100 comprises at least one first conductive component 101, at least one second conductive component 102 and at least one via 103 connecting the first conductive component 101 to the second conductive component 102. More typically, the via chain 100 comprises a plurality of first conductive components 101, a plurality of second conductive components 102 and a plurality of vias 103, wherein each of the vias 103 connects corresponding one of the first conductive components 101 to corresponding one of the second conductive components 102. For example, the via chain 100 may comprise up to a thousand vias 103 connecting the first conductive components 101 to the second conductive components 102 in series. The first conductive component 101 has an axis 1011 along an extending direction of the first conductive component 101 (such as the Y-direction of FIG. 1A). The via 103 has a center 1031 defining a shift distance S1 from the axis 1011 of the first conductive component 101. In FIGS. 1A-1C, the center 1031 of the via 103 is located at the negative X-direction relative to the axis 1011 of the first conductive component 101, and thus the shift distance S1 corresponds to a negative shift distance value.

According to some embodiments, the first conductive component 101 and the second conductive component 102 are disposed at different levels. The two different levels may be two levels which are disposed subsequently, such as the M1 level and the M2 level, the M2 level and the M3 level, or the like. In the case shown in FIGS. 1A-1C, the second conductive component 102 is disposed above the first conductive component 101. More specifically, the first conductive component 101 may be a portion of a bottom metal layer, such as a metal line of the bottom metal layer, and the second conductive component 102 may be a portion of a top metal layer, such as a metal line of the top metal layer. In other words, each of the first conductive component 101 and the second conductive component 102 may be formed of metal. For example, the first conductive component 101 and/or the second conductive component 102 may be formed of a metal composite (i.e. including more than one kind of metal), such as a metal composite comprising a barrier layer and a copper layer, a barrier layer and an aluminum layer, or the like. According to some embodiments, a width W2 of the second conductive component 102 (in the X-direction of FIG. 1A) may be larger than a width W1 of the first conductive component 101 (in the X-direction of FIG. 1A). According to some embodiments, the second conductive component 102 is formed such that, from a top view, an axis (not shown) of the conductive component 102 is parallel to the axis 1011 of the first conductive component 101 and directly penetrates the center 1031 of the via 103.

FIGS. 2A-2C illustrate a via chain 200. The first conductive component 201, the second conductive component 202 and the via 203 of the via chain 200 are disposed in a similar manner as shown in FIGS. 1A-1C. However, the center 2031 of the via 203 and the axis 2011 of the first conductive component 201 defines a shift distance S2 different from the shift distance S1. In FIGS. 2A-2C, the center 2031 of the via 203 is located on the axis 2011 of the first conductive component 201, and thus the shift distance S2 is zero.

FIGS. 3A-3C illustrate a via chain 300. The first conductive component 301, the second conductive component 302 and the via 303 of the via chain 300 are disposed in a similar manner as shown in FIGS. 1A-1C and 2A-2C. However, the center 3031 of the via 303 and the axis 3011 of the first conductive component 301 defines a shift distance S3 different from the shift distances S1 and S2. In FIGS. 3A-3C, the center 3031 of the via 303 is located at the positive X-direction relative to the axis 3011 of the first conductive component 301, and thus the shift distance S3 corresponds to a positive shift distance value.

Figure 4B:
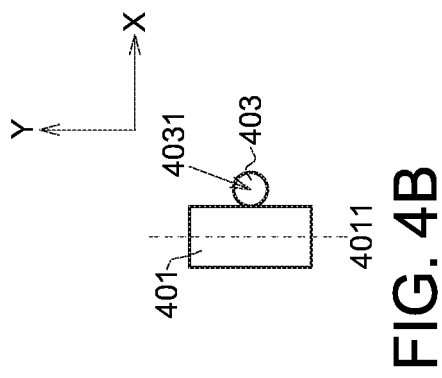
Figure 4C:
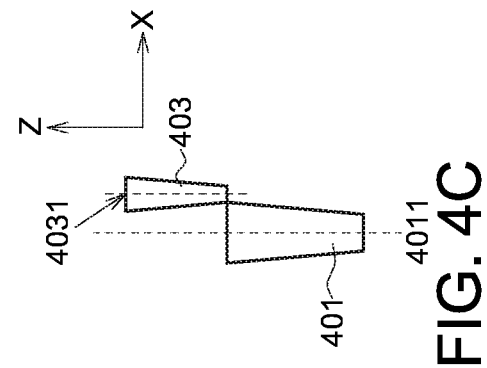
Figure 4A:
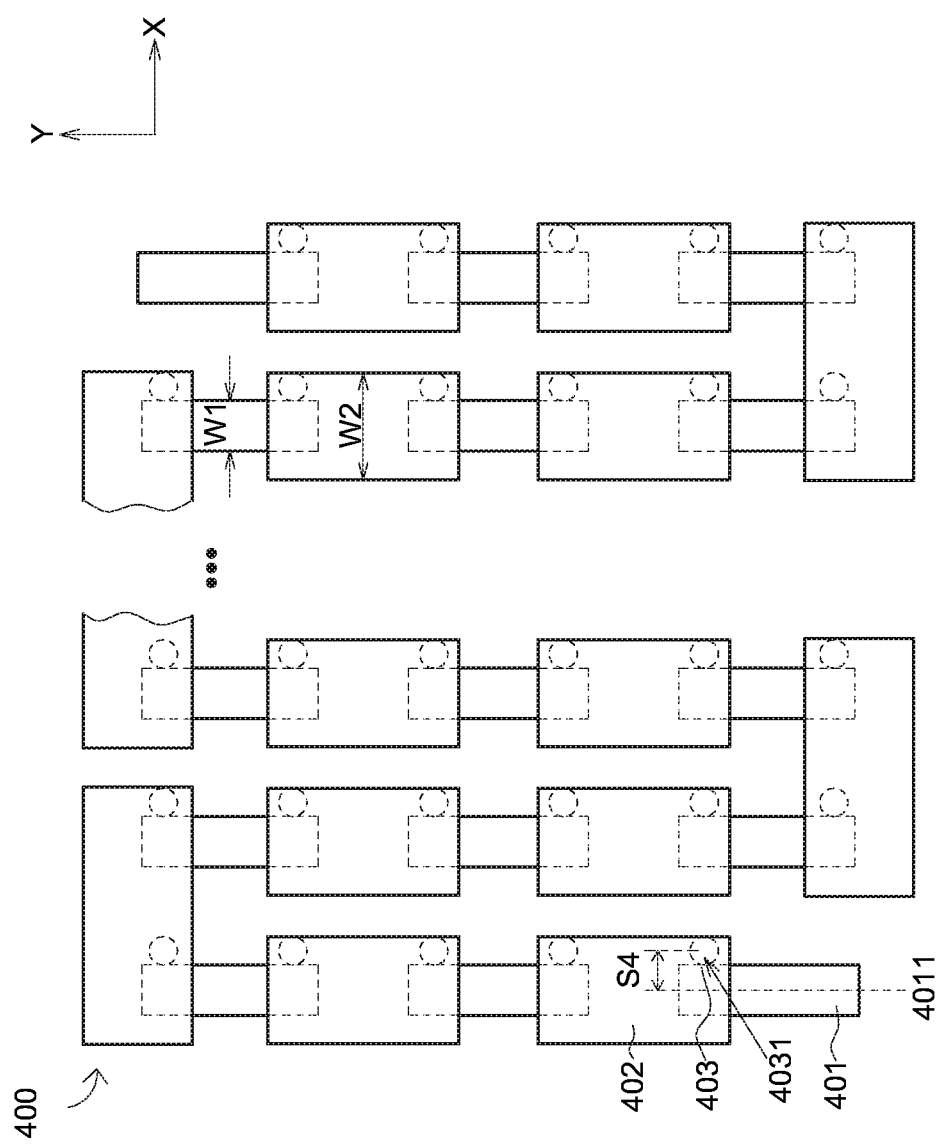

FIGS. 4A-4C illustrate a via chain 400. The first conductive component 401, the second conductive component 402 and the via 403 of the via chain 400 are disposed in a similar manner as shown in FIGS. 1A-1C to 3A-3C. However, the center 4031 of the via 403 and the axis 4011 of the first conductive component 401 defines a shift distance S4 different from the shift distances S1 to S3. In FIGS. 4A-4C, the center 4031 of the via 403 is located at the positive X-direction relative to the axis 4011 of the first conductive component 401, and thus the shift distance S4 corresponds to a positive shift distance value. In particular, the shift distance S4 is larger than the shift distance S3.

It is appreciated that the semiconductor structure comprises at least two via chains, such as four, five, twenty-five, thirty-tree, or even more via chains, which may be the same as or similar to the via chains 100, 200, 300 and 400 described above, wherein the shift distances of the via chains are all different. According to some embodiments, the semiconductor structure may comprise a plurality of via chains, wherein the shift distances of the plurality of via chains are gradually changed from a negative maximum shift distance value to a positive maximum shift distance value.

The via chains, such as the via chains 100, 200, 300 and 400, may be comprised in a testing structure of the semiconductor structure. Thereby, at least one dimensional feature of the semiconductor structure can be measured. For example, the semiconductor structure may be a wafer. The wafer comprises a plurality of active areas. In the active areas, the vias are connected to the first and second conductive components for signal transfer. A "standard" via chain having an arrangement similar to that in the active areas, such as the via chain 200, and a plurality of "derived" via chains, such as the via chains 100, 300 and 400, can be correspondingly disposed in the testing structure of the semiconductor structure. Thereby, one or more dimensional feature of the components in the active areas of the wafer can be obtained by testing the via chains in the testing structure.

Now the disclosure is directed to a testing method using a semiconductor structure as described above. First, the semiconductor structure is provided. Then, the resistances of the via chains are measured, respectively. The measurement may be carried out during a wafer acceptance test. A resistance-shift distance diagram illustrating a relationship between the resistances and the shift distances may be drawn accordingly, such as the exemplary resistance-shift distance diagram shown in FIG. 5. At least one dimensional feature can be obtained from the resistance-shift distance diagram.

Figure 5:
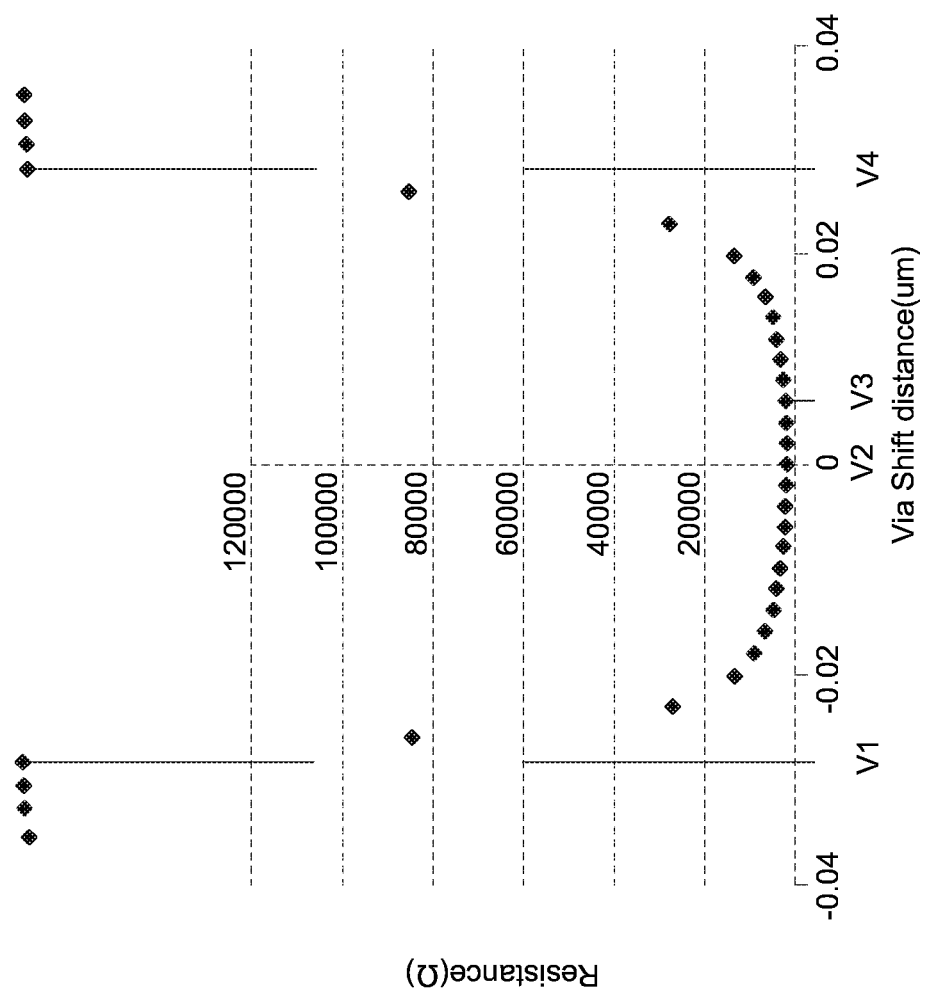
FIG. 5 shows an exemplary resistance-shift distance diagram of the semiconductor structure illustrated in FIGS. 1A-1C to 4A-4C.

Referring to FIG. 5, an exemplary resistance-shift distance diagram is shown, wherein the shift distance values V1, V2, V3 and V4 correspond to the values of the shift distance S1, S2, S3 and S4 respectively. The at least one dimensional feature that can be obtained from a resistance-shift distance diagram may comprise at least one selected from the group consisting of: a critical dimension of the first conductive component, a critical dimension of the via, and an alignment accuracy between the via and the first conductive component. In the case that a width of the second conductive component is larger than a width of the first conductive component, and the axis of the second conductive component is parallel to the axis of the first conductive component and penetrates the center of the via, the dimensional features listed above can be tested in a more accurate manner.

The critical dimension of the first conductive component may be obtained by calculating the difference between a negative shift distance value V1 at which the resistances corresponding to negative shift distances substantially stop to change and a positive shift distance value V3 at which the resistances corresponding to positive shift distances substantially begin to change. As the position of the via change from directly on the axis of the first conductive component (i.e., the case of the via chain 200 shown in FIG. 2) toward the negative or positive X-direction, the resistance may stay constant until the contacting area between the via and the first conductive component begin to change (such as the case of the via chain 300 shown in FIG. 3). At this time, because the contacting area is reduced, the resistance will increase. When the contacting area is further reduced to about zero (such as the case of the via chain 400/100 shown in FIG. 4/FIG. 1), the resistance will stop change. As such, it can be appreciated that the negative shift distance value V1 at which the resistances corresponding to negative shift distances substantially stop to change corresponds to the via chain 100 shown in FIG. 1, and the positive shift distance value V3 at which the resistances corresponding to positive shift distances substantially begin to change corresponds to the via chain 300 shown in FIG. 3. Since the distance between the location of the via 103 and the via 303 substantially equal to the critical dimension of the first conductive component 101/301, the critical dimension of the first conductive component can be obtained by calculating the difference between the values V1 and V3, i.e., |V3−V1|.

The critical dimension of the via may be obtained by calculating the difference between a positive shift distance value V3 at which the resistances corresponding to positive shift distances substantially begin to change and a positive shift distance value V4 at which the resistances corresponding to the positive shift distances substantially stop to change. The positive shift distance value V3 at which the resistances corresponding to positive shift distances substantially begin to change corresponds to the via chain 300 shown in FIG. 3, and the positive shift distance value V4 at which the resistances corresponding to positive shift distances substantially stop to change corresponds to the via chain 400 shown in FIG. 4. Since the distance between the location of the via 303 and the via 403 substantially equal to the critical dimension of the via 303/403, the critical dimension of the via can be obtained by calculating the difference between the values V3 and V4, i.e., |V4−V3|.

Figure 6:
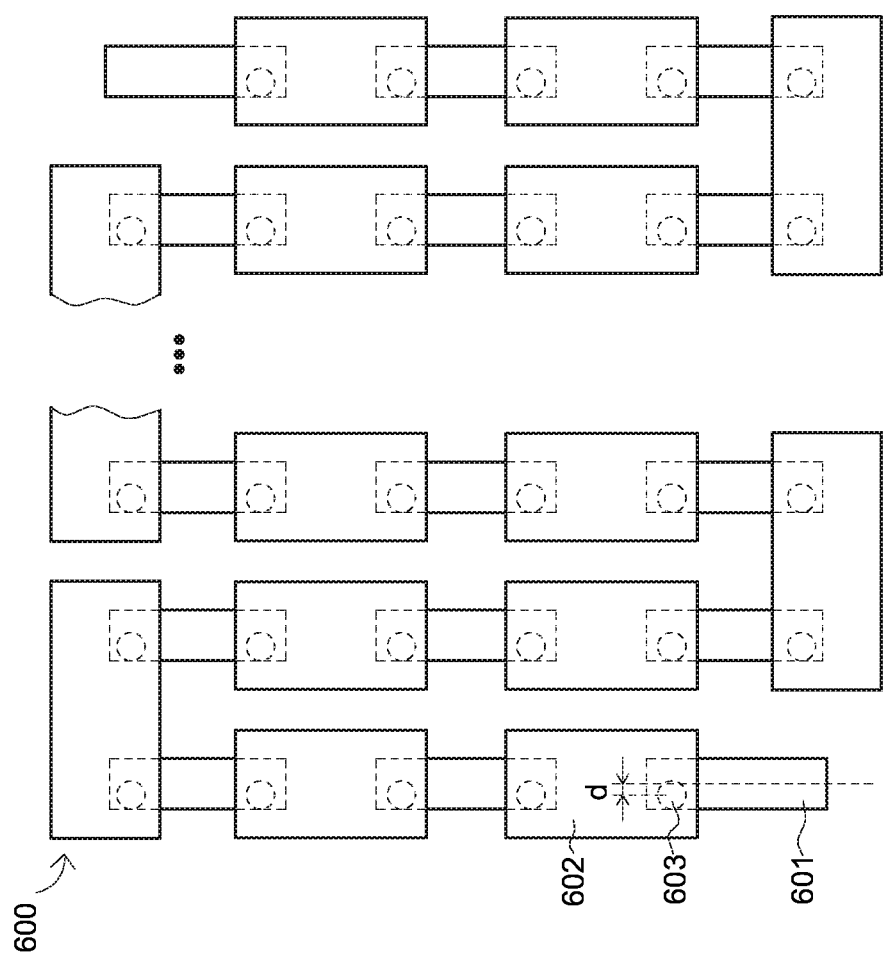
FIG. 6 illustrates a semiconductor structure according to some other embodiments.
Figure 7:
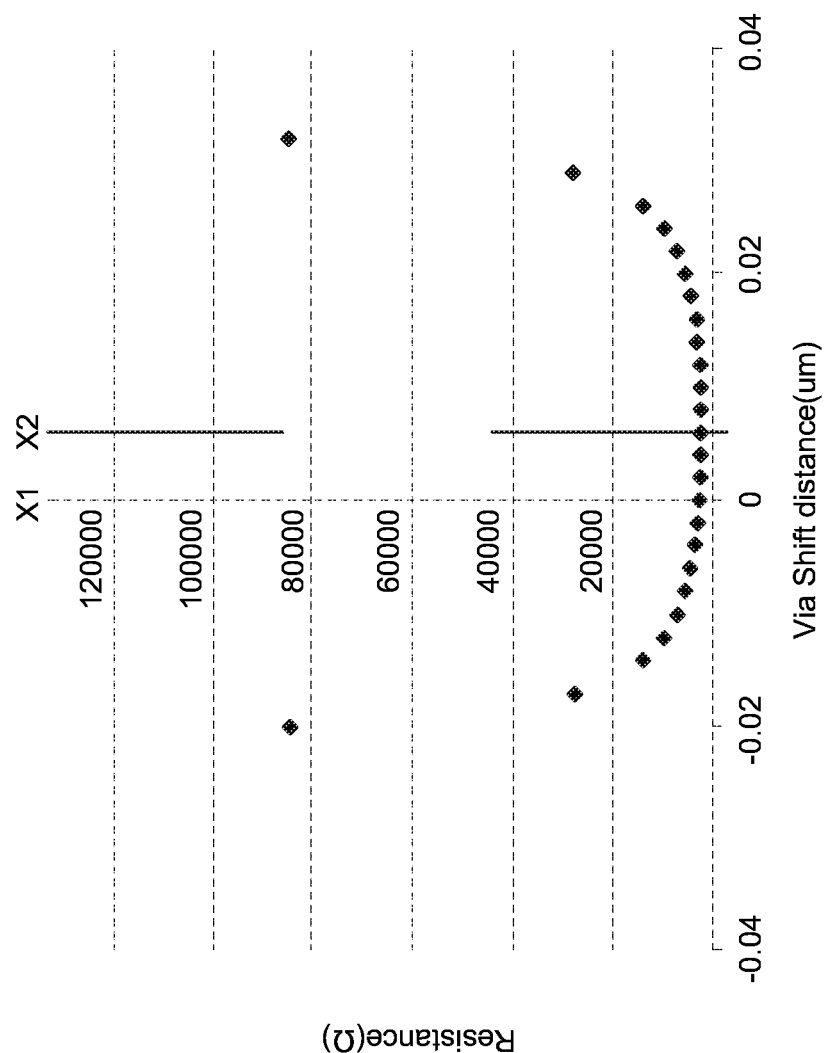
FIG. 7 shows an exemplary resistance-shift distance diagram of a semiconductor structure illustrated in FIG. 6.

As to the alignment accuracy between the via and the first conductive component, referring to FIGS. 6 and 7, another semiconductor structure according to some embodiments and a corresponding exemplary resistance-shift distance diagram are shown. Typically, the locations of the vias in the active areas of the semiconductor structure should be precisely on their design positions, and the corresponding "standard" via chain of the testing structure is like the case shown in FIG. 2. At this time, the central axis X1 of the resistance-shift distance diagram is also the symmetrical axis X2 of the dots. However, an alignment deviation of the vias may occur during manufacturing processes such as a lithography process, as shown in FIG. 6, the via 603 connecting the first conductive component 601 to the second conductive component 602 deviates by a distance d. Such an alignment deviation will reflect on the resistance-shift distance diagram. In this case, since the distance along the negative X-direction to the location at which the contacting area begin to change is shorter, and the distance along the positive X-direction to the location at which the contacting area begin to change is longer, the dots in the corresponding resistance-shift distance diagram moves toward the positive side. As such, the alignment accuracy between the via and the first conductive component can be obtained by calculating the difference between the symmetrical axis X2 of the resistance-shift distance diagram and the central axis X1 of the resistance-shift distance diagram, i.e., |the value of X2−the value of X1|.

In the semiconductor illustrated in FIGS. 1A-1C to 4A-4C, the first conductive component may be a portion of a bottom metal layer, such as a metal line of the bottom metal layer, and the second conductive component may be a portion of a top metal layer, such as a metal line of the top metal layer. As such, the measured critical dimension of the first conductive component is a top critical dimension of a bottom metal layer, the measured critical dimension of the via is a bottom critical dimension of a via, and the measured alignment accuracy between the via and the first conductive component is an alignment accuracy between a via and a bottom metal layer.

According to some other embodiments, the first conductive component may be disposed above the second conductive component. More specifically, the first conductive component may be a portion of a top metal layer, such as a metal line of the top metal layer, and the second conductive component may be a portion of a bottom metal layer, such as a metal line of the bottom metal layer. In such a case, the measured critical dimension of the first conductive component is a bottom critical dimension of a top metal layer, the measured critical dimension of the via is a top critical dimension of a via, and the measured alignment accuracy between the via and the first conductive component is an alignment accuracy between a via and a top metal layer.

In the testing method according to the embodiments, the measurement of the resistances of the via chains is carried out during a wafer acceptance test. As such, not only a critical dimension, but also an alignment accuracy can be tested. Further, the characteristics of the devices on the whole wafer can be measured. In addition, since a plurality of components are tested at the same time, a more accurate average value can be obtained. In some embodiments, the at least one dimensional feature obtained by the testing method described herein may be compared to at least one corresponding dimensional feature obtained by an in-line measurement.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
at least two via chains each comprising:
at least one first conductive component, wherein the first conductive component has an axis along an extending direction of the first conductive component;
at least one second conductive component; and
at least one via connecting the first conductive component to the second conductive component, wherein the via has a center defining a shift distance from the axis of the first conductive component;
wherein the shift distances of the via chains are different, the first conductive component and the via in one of the at least two via chains are externally tangent to each other, and the first conductive component and the via in another one of the at least two via chains are internally tangent to each other.

2. The semiconductor structure according to claim 1, wherein a width of the second conductive component is larger than a width of the first conductive component.

3. The semiconductor structure according to claim 1, wherein the first conductive component and the second conductive component are disposed at different levels.

4. The semiconductor structure according to claim 1, wherein the second conductive component is disposed above the first conductive component.

5. The semiconductor structure according to claim 1, wherein the first conductive component is disposed above the second conductive component.

6. The semiconductor structure according to claim 1, wherein each of the first conductive component and the second conductive component is formed of metal.

7. The semiconductor structure according to claim 1, wherein each of the via chains comprises a plurality of the first conductive components, a plurality of the second conductive components and a plurality of the vias, wherein each of the vias connects corresponding one of the first conductive components to corresponding one of the second conductive components.

8. The semiconductor structure according to claim 1, comprising a plurality of the via chains, wherein the shift distances of the plurality of via chains are gradually changed from a negative maximum shift distance value to a positive maximum shift distance value.

9. The semiconductor structure according to claim 1, comprising a testing structure comprising the via chains.

10. A testing method using a semiconductor structure, comprising:
providing the semiconductor structure, the semiconductor structure comprising a plurality of via chains each comprising:
at least one first conductive component, wherein the first conductive component has an axis along an extending direction of the first conductive component;
at least one second conductive component; and
at least one via connecting the first conductive component and the second conductive component, wherein the via has a center defining a shift distance from the axis of the first conductive component;
wherein the shift distances of the via chains are gradually changed from a negative maximum shift distance value to a positive maximum shift distance value;
measuring resistances of the via chains, respectively;
drawing a resistance-shift distance diagram illustrating a relationship between the resistances and the shift distances; and
obtaining at least one dimensional feature from the resistance-shift distance diagram.

11. The testing method according to claim 10, wherein a width of the second conductive component is larger than a width of the first conductive component.

12. The testing method according to claim 10, wherein the at least one dimensional feature comprises at least one selected from the group consisting of: a critical dimension of the first conductive component, a critical dimension of the via, and an alignment accuracy between the via and the first conductive component.

13. The testing method according to claim 12, wherein the critical dimension of the first conductive component is obtained by calculating the difference between a negative shift distance value at which the resistances corresponding to negative shift distances substantially stop to change and a positive shift distance value at which the resistances corresponding to positive shift distances substantially begin to change.

14. The testing method according to claim 12, wherein the critical dimension of the via is obtained by calculating the difference between a positive shift distance value at which the resistances corresponding to positive shift distances substantially begin to change and a positive shift distance value at which the resistances corresponding to the positive shift distances substantially stop to change.

15. The testing method according to claim 12, wherein the alignment accuracy between the via and the first conductive component is obtained by calculating the difference between a symmetrical axis of the resistance-shift distance diagram and a central axis of the resistance-shift distance diagram.

16. The testing method according to claim 10, wherein the at least one dimensional feature comprises at least one selected from the group consisting of: a top critical dimension of a bottom metal layer, a bottom critical dimension of a via, an alignment accuracy between a via and a bottom metal layer, a bottom critical dimension of a top metal layer, a top critical dimension of a via, and an alignment accuracy between a via and a top metal layer.

17. The testing method according to claim 10, wherein measuring the resistances of the via chains is carried out during a wafer acceptance test.

18. The testing method according to claim 10, wherein the at least one dimensional feature is compared to at least one corresponding dimensional feature obtained by an in-line measurement.

* * * * *